United States Patent [19]

Terashima et al.

[11] Patent Number: 4,960,721

[45] Date of Patent: Oct. 2, 1990

[54] METHOD FOR PURIFYING GROUP II-IV COMPOUND SEMICONDUCTORS

[75] Inventors: Kazutaka Terashima; Masaru Kawachi; Hiroaki Yoshida, all of Kanagawa, Japan

[73] Assignee: Kabushiki Kaisha Toshiba, Kanagawa, Japan

[21] Appl. No.: 268,926

[22] Filed: Nov. 9, 1988

[30] Foreign Application Priority Data

| Nov. 10, 1987 | [JP] | Japan | 62-282129 |
| Nov. 16, 1987 | [JP] | Japan | 62-287291 |
| Dec. 24, 1987 | [JP] | Japan | 62-325450 |
| Aug. 22, 1988 | [JP] | Japan | 63-207527 |

[51] Int. Cl.$^5$ .................. H01L 21/00; H01L 21/02; H01L 21/26; H01L 21/203
[52] U.S. Cl. .................. 437/247; 437/10; 437/13; 148/DIG. 60; 148/DIG. 71
[58] Field of Search .......... 437/130, 133, 81, 82, 437/159, 165, 167, 127, 10, 13, 247; 156/621, 624; 148/DIG. 99, DIG. 60

[56] References Cited

U.S. PATENT DOCUMENTS

| 3,836,408 | 9/1974 | Kasano | 437/132 |
| 3,933,538 | 1/1976 | Akai et al. | 437/133 |
| 4,244,753 | 1/1981 | Harnack | 437/159 |
| 4,315,796 | 2/1982 | Nishizawa | 156/622 |
| 4,465,527 | 8/1984 | Nishizawa | 437/119 |
| 4,526,632 | 7/1985 | Nishizawa | 437/167 |
| 4,565,156 | 1/1986 | Nishizawa et al. | 437/119 |
| 4,572,763 | 2/1986 | Nishizawa | 156/621 |
| 4,619,718 | 10/1986 | Nishizawa | 437/127 |
| 4,632,711 | 12/1986 | Fujita et al. | 437/133 |
| 4,685,979 | 8/1987 | Nishizawa | 437/81 |
| 4,738,426 | 11/1988 | Nishizawa | 437/167 |
| 4,783,426 | 11/1988 | Nishizawa | 437/167 |

FOREIGN PATENT DOCUMENTS

| 0003798 | 1/1982 | Japan . |
| 0005325 | 1/1982 | Japan . |
| 0007131 | 1/1982 | Japan . |
| 0063183 | 4/1983 | Japan . |
| 0009113 | 1/1988 | Japan . |

OTHER PUBLICATIONS

Nishizawa, J., Blue Light Emission from ZnSe p-n junctions, J. Appl. Phys. 57(6), Mar. 15, 1985, pp. 2210-2216.

Kiyosawa, T., Vapor Phase Crystal Growth of Zinc Selenide under Controlled Partial Pressure and its Crystal Structure, JJM, vol. 13, 1972, pp. 248-254.

Isskiki, M., Preparation of High Purity Zinc Selenide Single Crystals and Evaluation Through Photoaluminescence Spectra, J. Crystal Growth, vol. 73, No. 2, Nov. 1985, pp. 221-225.

Aven, M., Purification of II-VI Compounds by Solvent Extraction, Appl. Physics Letters, vol. 1, No. 3, Nov. 1, 1962, pp. 53-54.

Primary Examiner—Brian E. Hearn
Assistant Examiner—B. Everhart
Attorney, Agent, or Firm—Finnegan, Henderson, Farabow, Garrett, and Dunner

[57] ABSTRACT

A method of heat treatment for purifying a Groups II-VI compound semiconductor and for producing a purity Groups II-VI compound semiconductor crystal using a sealed container placed a Groups II-VI compound semiconductor crystal as a raw material is disclosed. The process includes heating means applied to the sealed container having a temperature difference which has a high-temperature zone and a low-temperature zone into the sealed container, placing the raw material into the high-temperature zone of the sealed container, using a heat atom making an atmosphere of either a Group II element or a Group VI element, or a mixed atmosphere of either which is necessary to treat the Groups II-VI compound semiconductor into the sealed container, and using a Groups II-VI compound semiconductor as raw material.

22 Claims, 5 Drawing Sheets

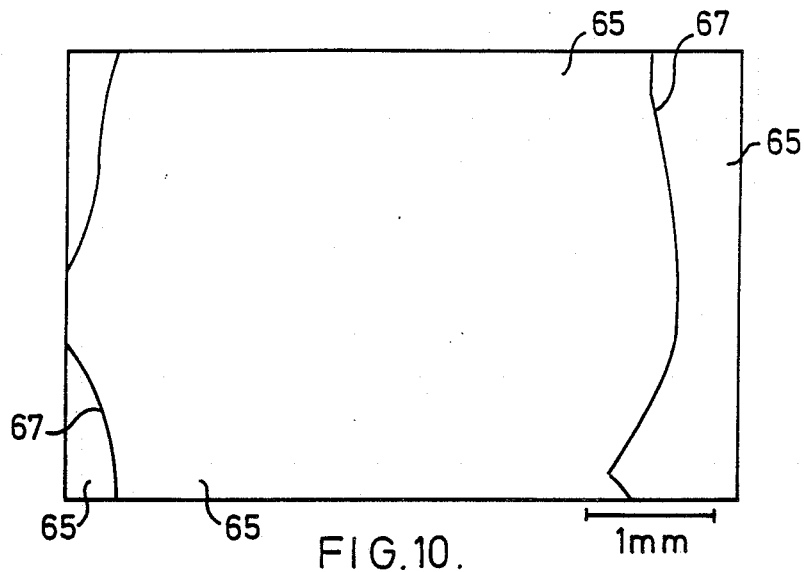
FIG.10.  1mm
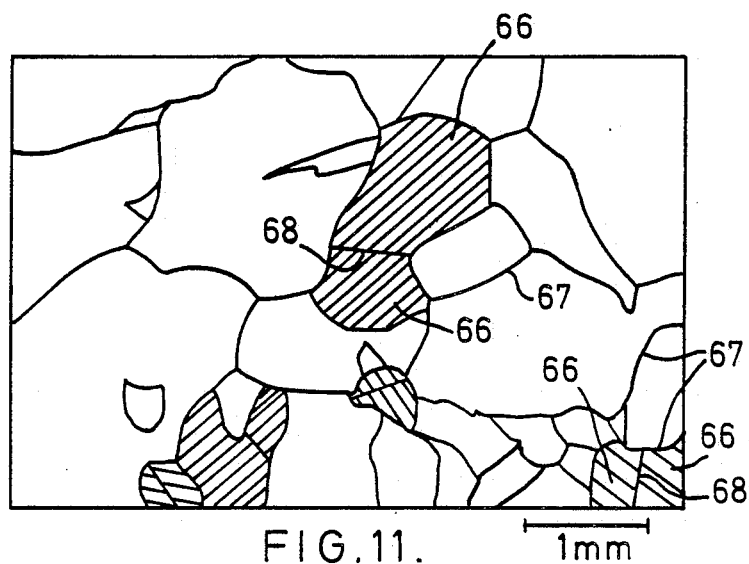
FIG.11.  1mm

METHOD FOR PURIFYING GROUP II-IV COMPOUND SEMICONDUCTORS

BACKGROUND OF THE INVENTION

1. Field of the Invention

This invention relates to a method of heat treatment of a Groups II-VI compound semiconductor, in particular, the method of heat treatment for purifying the Groups II-VI compound semiconductor and the heat treatment method for producing a Groups II-VI compound semiconductor of a high degree of purity single crystal.

2. Discussion of Background

Light-emitting semiconductor elements (for example, Light-Emitting Diodes (LEDs)) which have light-emitting zones from red to green using compound semiconductor materials are in mass-production, and further developments are in progress in order to improve their brightness. However, no satisfactory production techniques have yet been provided for blue color light-emitting elements which have blue light emitting zones in the visible region.

For the production of a blue light-emitting element, it is necessary that the forbidden band (bandgap) of the semiconductor material should exceed 2.6 eV. Recently attention has been drawn to Groups II-VI compound semiconductors as semiconductors which satisfy this requirement. Amongst these, zinc sulphide (ZnS), zinc selenide (ZnSe) and mixed crystal (ZnSSe) whose forbidden bands are with the 2.6-3.7 eV region are viewed as promising. Hereafter, the above material is referred to by the general term of zinc sulphide selenide ($ZnS_xSe_{1-x}$; $0 \leq x \leq 1$). For the methods of growing the above-mentioned single crystal, there are the high-pressure melting methods which are known as crystal growth methods under conditions of high temperature and high pressure, for instance, the Bridgeman method, the Tammann method, the sealed tube chemical transport method, and the sublimation method. Using the above methods, it is possible to obtain single crystal with a comparatively large diameter.

However, the materials used for growing the above single crystal are mostly in powdered form or are irregular polycrystal materials. That is to say, the inclusion factors by wt ppm in an example of such a material have been measured as Al, Si:0.5, Cu, Cr:0.3, Mg:0.1. Since, for this reason, single crystal made from this kind of raw material naturally inherits impurities, crystal which would satisfy the purpose of use could not be obtained. Also, since these impurities have a complex relationship with lattice defects, there were problems such as limitations in the production of light-emitting elements from this crystal. Furthermore, there are no detailed reports of prior extraction of impurities for these materials.

As described in the above-mentioned prior art, since large amounts of impurities such as copper, aluminum and magnesium were included in the compound semiconductor crystal used for light-emitting elements, the single crystal made from these raw materials had poor purity, for instance, in single crystals such as ZnS and ZnSe, there were problems of controlling the electrical resistance and the type of conductivity, and the problem of obstruction of the light-emitting characteristic. For the above reasons there have been great hindrances to the achievement of blue light-emitting elements with superior performance.

SUMMARY OF THE INVENTION

The object of this invention is to provide a method of heat treatment of a Groups II-VI compound semiconductor, in particular, a purification method for Groups II-VI compound semiconductor, a production method for Groups II-VI compound semiconductor single crystal, which is availably used for manufacturing the semiconductor light-emitting elements. That is to say, single crystallisation is carried out using a sealed tube (sealed container), by forming a high-temperature zone and a low-temperature zone in the sealed tube, specifying the atmosphere of a host atom inside this sealed tube by placing compound semiconductor in the high-temperature, and impurity processing using the temperature difference.

That is to say, the object of the invention is a method of heat treatment for improving the purity of Groups II-VI compound semiconductor by placing a Groups II-VI compound semiconductor in the high-temperature zone in a sealed tube in which a temperature difference is provided, and transporting the impurities in this compound semiconductor to the low-temperature zone of the sealed tube. And an atmosphere of a host atom carrying out by making in the sealed tube is an atmosphere of either the Group II element or the Group VI element, or a mixed atmosphere of either of the two Group elements with a halogen element.

Another object of the invention is a method of heat treatment for improving the purity of Groups II-VI compound semiconductor, in the purification of compound semiconductors using sealed tubes, by arranging a Groups II-VI compound semiconductor in the high-temperature zone and an impurity adsorbent in the low temperature zone respectively in a sealed tube in which a temperature difference is provided and transporting the impurities in this compound semiconductor to the low temperature zone of this sealed tube.

Another object of the invention is a method of heat treatment for producing single crystal which has the characteristic of producing single crystal of improved purity when producing compound semiconductor single crystal using a sealed tube by placing a Groups II-VI compound semiconductor crystal in the high-temperature zone and an impurity adsorbent in the low-temperature zone in a sealed tube in which a temperature difference is provided, is carried out by making in the sealed tube an atmosphere of either the Group elements, or a mixed atmosphere of either of the Groups with a halogen element.

Another object of the invention is a method of heat treatment for producing a purity single crystal, when producing compound semiconductor single crystal using sealed tubes, of placing polycrystal Groups II-VI compound semiconductor in the molten Group II element or Group VI which composes the Groups II-VI compound semiconductor in the high-temperature zone in a sealed tube in which a temperature difference is provided, and forming this polycrystal into single crystal by solid-phase growth by increasing the temperature to a specified temperature.

Another object of invention is a method which produces purity single crystal from a Groups II-VI compound semiconductor having many twin crystal. The method has a process of which is placed with small contacts between the raw material and the inner wall in the sealed tube in order to reduce the contact area thereof.

Another object of the invention is a method of heat treatment for producing of compound semiconductors using sealed tubes, of respectively placing single crystal Groups II–VI compound semiconductor in the high-temperature zone and single crystal of the same type in the low-temperature zone in a sealed tube in which a temperature difference is provided, and carrying out single crystal growth by making a mixed atmosphere of the Group II element or the Group VI element or a mixed element of either of the Groups with a halogen element.

This invention achieves purification to a high degree in the production of Groups II–VI compound semiconductor single crystal which can be used for blue color light-emitting elements, on the basis of providing a temperature difference in a sealed tube, placing the material to be purified in the high-temperature zone and transporting the impurities in the material to be purified to the low-temperature zone, and developing the atmosphere inside the sealed tube, the impurity transporter and the impurity adsorbents in order to purify to a high degree by extracting the impurities included in the raw materials.

Also, single crystal growth is achieved by solid-phase growth by placing Groups II–VI compound semiconductor polycrystal in the molten Group II element or VI element of which it is composed in the high-temperature zone of a sealed tube provided with a temperature difference.

Furthermore, based on the above, single crystal of large diameter and few faults (few twin crystals) can be obtained by sealing Groups II–VI compound semiconductor crystal, which includes many twin crystals and has been produced in a first sealed tube, into a second sealed tube with a larger diameter so that the contact area with the inner wall is greatly reduced, and carrying out heat treatment based on the above mentioned.

Then, by laminating a crystal layer of the same Groups on a crystal substrate which is produced based on the above, and forming this crystal layer into a light-emitting junction as a light-emitting layer, good light-emitting properties can be obtained in the element characteristics.

BRIEF DESCRIPTION OF THE DRAWINGS

FIG. 10 is a sketch of the microphotograph showing the crystal structure of single crystal obtained by the embodiment of this invention;

FIG. 11 is a sketch of the microphotograph showing the crystal structure of crystal which contains twin crystals;

DETAILED DESCRIPTION OF THE PREFERRED EMBODIMENT

An embodiment of a method according to the present invention will now be described with reference to the accompanying drawings.

Figure 1:
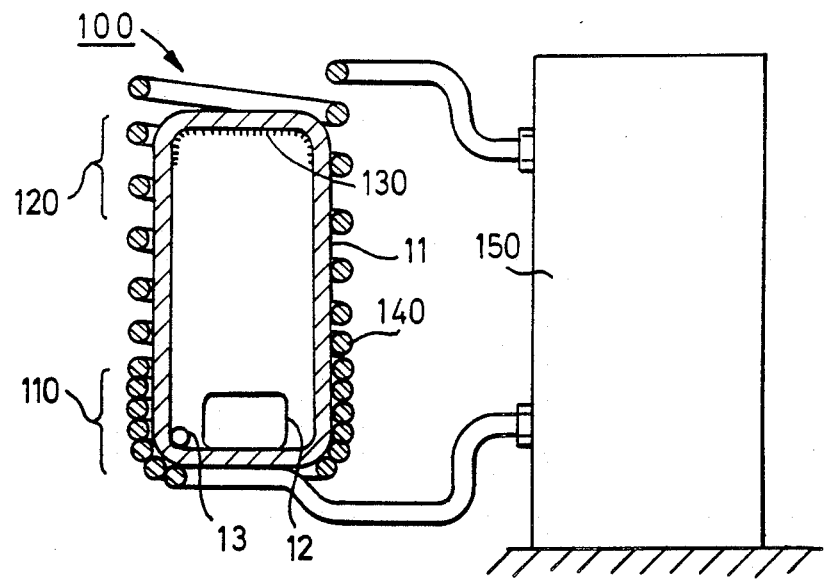
FIG. 1 is a cross-section showing the sealed tube and the arrangement of the raw materials housed inside it used in the present invention.
Figure 2:
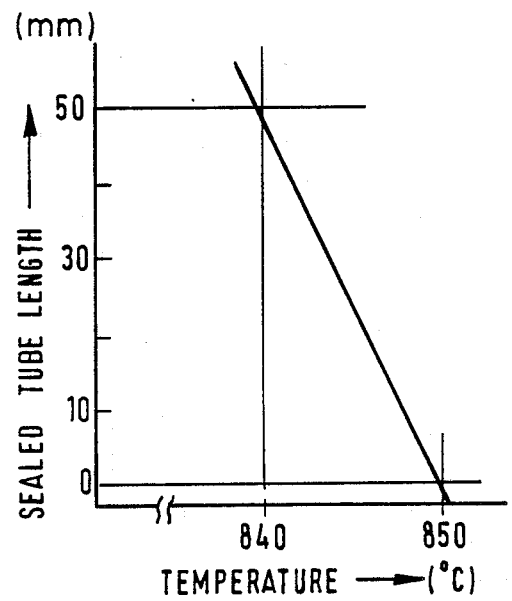
FIG. 2 is a graph showing the heat treatment conditions for the sealed tubes used in the embodiment of this invention.

FIG. 1 is a cross-section showing the sealed tube used in the embodiments of this invention and its internal arrangement. As shown in FIG. 1, the material 12 to be purified, for instance polycrystal ZnSe, is placed in sealed tube 11 made of heat-resistant material, for instance quartz, forming an atmosphere of a transporter 13 inside the sealed tube (sealed container) 11. At the same time, at least one transporter (host atom) 13 for the impurities in the raw material, selected from Zn, the chalcogen elements, in particular Se, and the mixed element of either of Zn or Se with the halogen elements, in particular iodine is sealed inside the tube. The sealed tube is exhausted to $10^{-6}$ Torr and the top is then melt-sealed. The lower part of sealed tube 11, in which raw material 12 and transporter 13 are arranged, is placed in the high-temperature zone 110 of a heating furnace 100 and the upper pert is placed in the low-temperature zone 120 of the furnace 100 respectively, and heat treatment is applied in this condition for, for instance, approximately 2 weeks. The furnace 100 is composed with an electric heater 140 as like as coil which is formed with a closely winding coil portion at a lower side and a sparsely winding coil portion at lan upper side, and an electric power supplying equipment 150 for supplying the controlled current to the coil 140. As shown in FIG. 2, this heat treatment is carried out with a temperature gradient in the furnace 100, with the high-temperature zone 110 being, for instance, 850° C. and the low-temperature zone 120 being, for instance 840° C.

By carrying out the above, impurities such as Cu, Al and Cr in the polycrystal ZnSe which is raw material 12 are transported to the low-temperature zone by transporter 13 and are deposited to the inner wall 130 in the tube 11. This heat treatment was carried out in sealed tube 11 of diameter 20 mm and length 50 mm. 50 g of polycrystal ZnSe raw material 12 and 10 mg of Zn impurity transporter 13 were respectively sealed into the tube which was provided with a temperature difference, the high-temperature zone being 850° C. Table 1 shows the result of analysis by the ICP (Injected Coupled Plasma) method for the respective impurity concentrations in the raw material and that material after this heat treatment.

TABLE 1

(Units of concentration: wt ppm)

| Condition | Impurity | | | | |
|---|---|---|---|---|---|
| | Cu | Al | Cr | Mg | Si |
| Raw material after heat treatment | 0.01 | 0.3 | 0.1 | 0.1 | 0.5 |
| Raw material | 0.3 | 0.5 | 0.3 | 0.1 | 0.5 |

As can be seen in Table 1, it is clear that there was outstanding progress in the purification of the raw material to a high degree and, in particular, a great effect in the extraction of heavy metals such as Cr and Cu.

Furthermore, apart from the above-mentioned Zn, as the atmosphere in the sealed tube, Se or a mixed atmosphere of Zn with a halogen element, or a mixed atmosphere of Se with a halogen element, which have already been mentioned, are excellent, and adsorption of impurities suited to the respective atmospheres is possible.

Figure 3:
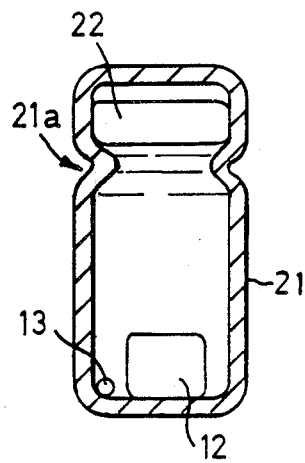
FIG. 3 is a cross-section showing the state of the sealed tube used in the embodiment of this invention.

Next, another embodiments of this invention are described with reference to FIG. 3. FIG. 3 shows a cross-section of the sealed tube and the arrangement of its interior which was used in these embodiments. As shown in FIG. 3, the material 12 to be purified, for instance polycrystal ZnSe, is placed in sealed tube 21 made of heat-resistant material, for instance quartz, forming an atmosphere inside the sealed tube. At the same time, at least one transporter (host atom) 13 for the impurities in the raw material, selected from Zn, the chalcogen elements, in particular Se, and the mixed element of either of Zn or Se with a halogen element, for instance, iodine is placed in the lower part. Adsorbent 22, for instance single crystal ZnSe, for adsorption of the impurities which have been transported is housed in the constricted part 21a. The sealed tube is exhausted to $10^{-6}$ Torr and the top is then melt-sealed. The lower part of sealed tube 21, in which raw material 12 and transporter 13 are arranged, is placed in the high-temperature zone of a heating furnace (as same as shown in FIG. 1) and the upper part is placed in the low-temperature zone of the furnace respectively, and heat treatment is applied in this condition for, for instance, approximately 2 weeks. As shown in FIG. 2, this heat treatment is carried out with a temperature gradient in the furnace, with the high-temperature zone being, for instance, 850° C. and the low-temperature zone being, for instance, 840° C.

By carrying out the above, impurities such as Cu, Al and Cr in the polycrystal ZnSe which is raw material 12 are transported by transporter 13 to single crystal ZnSe adsorbent 22 which is placed in the low-temperature zone and are adsorbed.

This heat treatment was carried out in sealed tube 21 of diameter 20 mm and length 50 mm. 50 g of polycrystal ZnSe raw material 12, 10 mg of Zn transporter 13 and 5 g of single crystal ZnSe adsorbent 22 were respectively sealed into the tube which was provided with a temperature difference, the raw material and the transporter being placed in the high-temperature zone at 850° C. and the adsorbent being placed in the low-temperature zone at 840° C. Table 2 shows the result of analysis by the ICP (Injected Coupled Plasma) method for the respective impurity concentrations in the raw material and that material after this heat treatment, and a marked reduction in heavy metals such as Cu and Cr was observed. Also, Table 3 shows the results of a study of the change in the impurity concentration in adsorbent 22.

TABLE 2

(Units of concentration: wt ppm)

| Condition | Impurity | | | | |
|---|---|---|---|---|---|
| | Cu | Al | Cr | Mg | Si |
| Raw material after heat treatment | 0.01 | 0.3 | 0.1 | 0.1 | 0.5 |
| Raw material | 0.3 | 0.5 | 0.3 | 0.1 | 0.5 |

TABLE 3

(Units of concentration: wt ppm)

| Condition | Impurity | | | | |
|---|---|---|---|---|---|
| | Cu | Al | Cr | Mg | Si |
| Before use | 0.3 | 0.5 | 0.3 | 0.1 | 0.5 |
| After use | 0.8 | 0.5 | 0.5 | 0.1 | 0.5 |

As can be seen in Table 3, it is clear that, since the impurity concentration in adsorbent 22 exhibits a marked increase, the impurities contained in raw material 12 are transported to adsorbent 22 by transporter 13 and adsorbed. This confirms the results of Table 2.

Incidentally, this invention is not limited to the above embodiment and suitable adsorption of impurities is possible in various atmospheres apart from Zn, such as Se already mentioned, or a mixed atmosphere of Zn with a halogen or a mixed atmosphere of Se with a halogen.

Moreover, for the above impurity adsorbent it is appropriate to use a compound semiconductor of the same type as the Groups II–VI compound semiconductor which is placed in the high-temperature zone.

Incidentally, although an embodiment with ZnSe has been shown as an example, needless to say, the same effect can be applied for other Groups II–VI compound semiconductor materials, such as ZnS, ZnTe, CdSe and CdTe.

Next, another embodiment of this invention is described with reference to FIGS. 4 to 6.

Figure 4A:
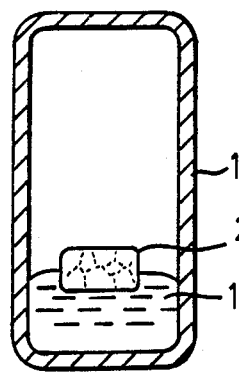
FIG. 4 (a) and (b) are each cross-sections showing the production, in process order, from polycrystal ZnSe to single crystal ZnSe by solid-phase diffusion according to the invention.
Figure 4B:
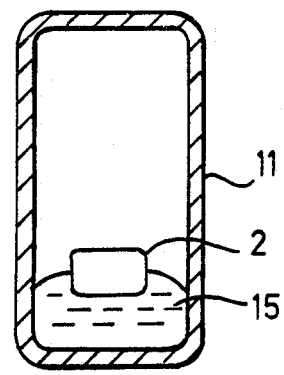
Figure 5:
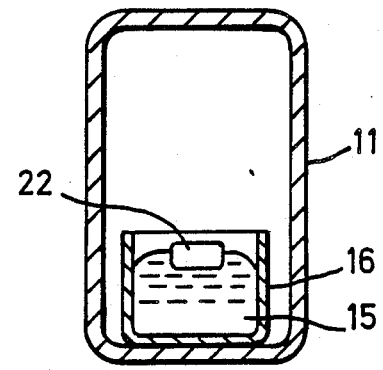
FIG. 5 is a cross-section showing the sealed tube with $Al_2O_3$ crucible of the embodiment of this invention.

As shown in FIG. 4 (a) and (b), practically the same crystallisation can be achieved by carrying out heat treatment of Groups II–VI compound semiconductor material, for instance, ZnSe 32, placed in the high-temperature zone in the lower part of ampul (sealed container) 11 in melted Zn 15 for 20–10,000 hours at 850°–1100° C. FIG. 4 (b) shows single crystal ZnSe 42. Crystallisation is carried out by maintaining a temperature gradient of at least 10° C. between the high- and low-temperature zones of the ampul.

Next, the electrical resistance of crystals such as ZnSe and ZnSSe can be reduced by adding, for example, Al to the Zn as a 3rd impurity and carrying out diffusion and growth of these crystals. When adding active impurities (for example, as donor) such as Al, the heat treatment can be carried out in a crucible 16 of $Al_2O_3$ or BN, as shown in FIG. 5.

Figure 6A:
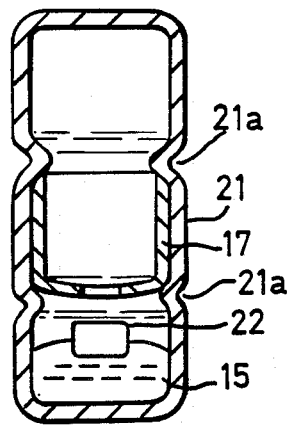
FIG. 6 (a) and (b) are each cross-sections showing the production, in process order, of single crystal ZnSe by using melted Zn according to the invention.
Figure 6B:
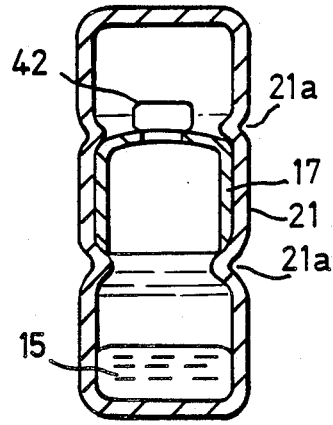

Next, the method shown in FIG. 6 (a) and (b) has the characteristic that, by forming single crystal supporter 17 inside ampul 21 and turning the ampul upside down when cooling, as shown in FIG. 6 (b), Zn 15 and obtained single crystal 42 are separated. Also, crystal supporter 17 may be fitted using constricted portion 21a of ampul 21.

There are the following advantages when using these embodiments.

(1) Solid-phase growth of high-purity single crystal is simply achieved. Moreover, since the color of the single crystal obtained was tinged with white, it was confirmed that the band gap had become larger.

(2) It is possible to align face (twin crystal) defects in one direction. After heat treatment for 2 weeks, the twin crystal in the ZnSe single crystal extracted had been reduced by 70% or more, and it was confirmed that the crystal had become of high quality.

(3) Low resistance can be obtained.

(4) Stable doping of donor or acceptor impurities can be carried out.

(5) Since distortion of the solidified film which is formed on the single crystal due to solidification of, for instance, Zn is not impressed, the properties of the single crystal are improved.

Figure 7:
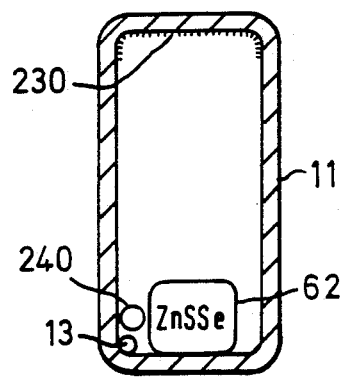
FIG. 7 is a cross-section showing the sealed tube of an embodiment of this invention.

Next, the sealed tube used in another embodiment and the arrangement of its interior are shown in cross-section in FIG. 7. As shown in FIG. 7, the following are sealed into sealed tube 11 which is formed of a heat-resistant material, for instance quartz:

ZnSSe single crystal 62 which is material obtained by the Bridgeman method;

at least one substance selected from Zn, chalcogen elements such as Se and the mixed element of either of Zn or Se with a halogen element such as iodine which, as well as forming the atmosphere inside the sealed tube, is the transporter for the impurities in the raw material; and S (sulfur)

The tube is exhausted to about $10^{-6}$ Torr and is then melt-sealed. The lower part of sealed tube 11, in which ZnSSe single crystal 62 and transporter 13 have been arranged, is placed in the high-temperature zone of a heating furnace and the upper part of the tube is place in the low-temperature zone of the furnace, and heat treatment is carried out in this state for, for instance, 2 weeks. This heat treatment is carried out in a heating furnace with a temperature gradient as shown in FIG. 2, with the temperature of the high-temperature zone being, for instance, 850° C. and the temperature of the low-temperature zone being, for instance, 840° C. By this means, the impurities such as Cu, Al and Cr in ZnSSe single crystal 62, which is the raw material, are transported to the low-temperature zone 230 of the tube by transporter 13 and deposited.

In this heat treatment, a quartz ampul is used for sealed tube 11 which has a diameter of 50 mm and a length of 150 mm. 15 g of ZnSSe single crystal 62, 10 mm of Zn transporter 13 and an excess of S (Sulfur) 240 as diffusion agent are laced in the lower part, and 10 g of ZnSe single crystal 14 which is used as the adsorbent are placed in the upper part of the tube, respectively. After the above-mentioned vacuum-sealing has been carried out, the tube is placed in an electric furnace with a temperature distribution as shown in FIG. 2 and heat treatment is carried out.

After heat treatment for 2 weeks, the twin crystal in the ZnSSe single crystal 62 extracted had been reduced by 70% or more, and it was confirmed that the crystal had become of high quality.

The atmosphere for the heat treatment is at a pressure of at least 10 atmospheres. Also, the temperature of the heat treatment is selected and set within the range of 700° C.–1250° C. Moreover, the case has been described of a temperature difference between the high-temperature zone and the low-temperature zone of 10° C., but any temperature difference of not more than 100° C. is effective.

Figure 8:
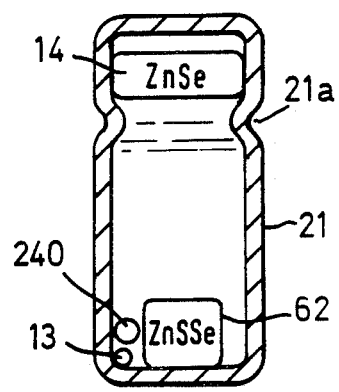
FIG. 8 is cross-section showing the sealed tubes used in an embodiment of this invention and the arrangement of the ZnSSe single crystal, etc. housed in them.

Next, in the embodiment shown in FIG. 8, a quartz ampul is used for sealed tube 21 which has the same diameter of 50 mm as in aforementioned embodiment. However, this quartz ampul is provided with a constricted portion 21a in the upper part and, for instance 10 g of ZnSe single crystal 14 which is used as the adsorbent is housed here. 150 g of ZnSSe single crystal 62, 10 mg of Zn as transporter 13 and an excess of S (Sulfur) 240 are respectively housed in the lower part. After carrying out vacuum-sealing in the same way as in aforementioned embodiment, the ampul is placed in an electric furnace provided with the temperature distribution shown in FIG. 2 and the same heat treatment is carried out.

By carrying out the above, impurities, such as Cu, Al and Cr, in ZnSe single crystal 52 which is processed in this way are transported to the low-temperature zone of sealed tube 11 to ZnSe single crystal 14 for adsorption which is housed in the low-temperature zone in the upper part of sealed tube 21 by transporter 13 and adsorbed.

Figure 9:
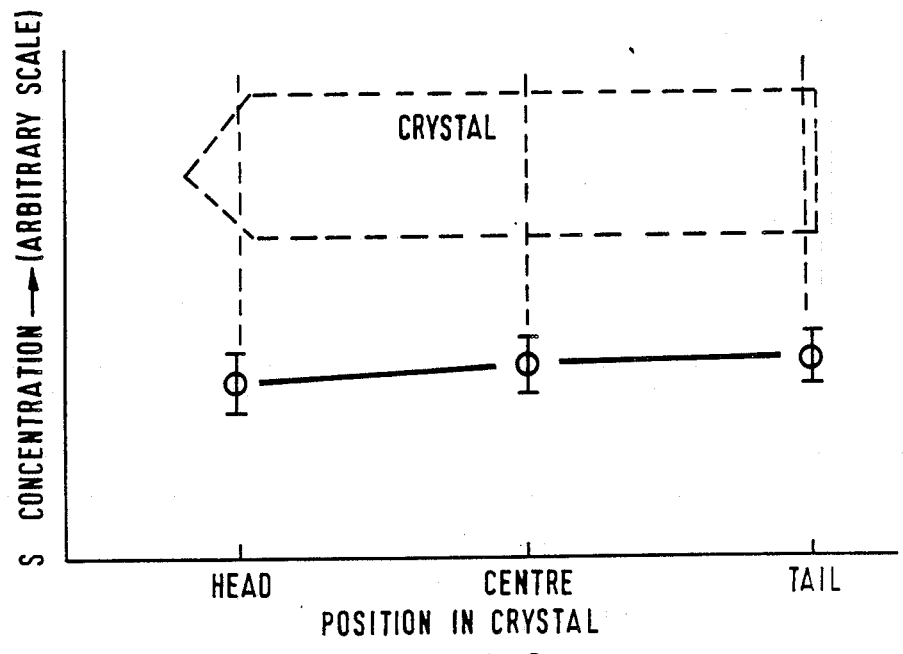
FIG. 9 is a graph showing the S concentration in ZnSSe single crystal obtained by an embodiment of this invention.

The concentration of S in the single crystal obtained in the above mentioned process was confirmed as being very even in the length direction of the single crystal, as shown in FIG. 9.

The impurity concentrations in ZnSSe single crystal 62 to be processed and those produced by the above-mentioned process were analysed by the ICP (Injected Coupled Plasma) method. The results shown in Table 4 below were obtained.

TABLE 4

(Units of concentration: wt ppm)

| Condition | Impurity | | | | |
|---|---|---|---|---|---|
| | Cu | Al | Cr | Mg | Si |
| ZnSSe single crystal after treatment | 0.01 | 0.3 | 0.1 | 0.1 | 0.5 |
| Untreated ZnSSe single crystal | 0.3 | 0.5 | 0.3 | 0.1 | 0.5 |

Next, regarding to twin crystals, the results of the treated crystal of the embodiment is obtained a follows. 100 mg of, for instance, Se was sealed into the sealed tube in order to produce an atmosphere of Se and, at the same time, a zinc chalcogenide (ZnSSe) to be treated was also sealed in. Heating was continued for 10 days, with the high-temperature zone at 950° C. and the low-temperature zone at 900° C., and then the processes of cooling and extraction were carried out. FIGS. 10 and 11 show a comparison by sketches of the microphotographs with the growth state of polycrystal in which Se was not used. That is to say, in FIG. 10 which shows crystal treated by the method of this invention, a good single crystal state 65 can be seen, and this shows that the progress of the single crystal crystallisation 66 has been greatly accelerated. A line 67 shows a boundary layer. As opposed to this, twin crystals 68 can be clearly seen in FIG. 11. Incidentally, an almost similar result was obtained when using Zn as the atmosphere.

Next, still another embodiments of this inventions are explained with reference to Figures.

Figure 12:
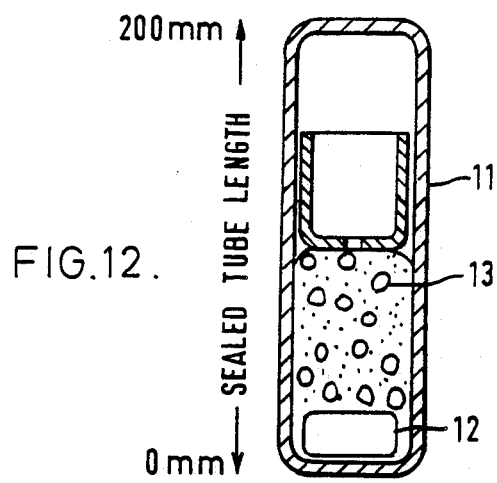
FIG. 12 is a cross-section showing the sealed tube used in the embodiment of this invention and the arrangement of raw material, etc. housed inside it.
Figure 13:
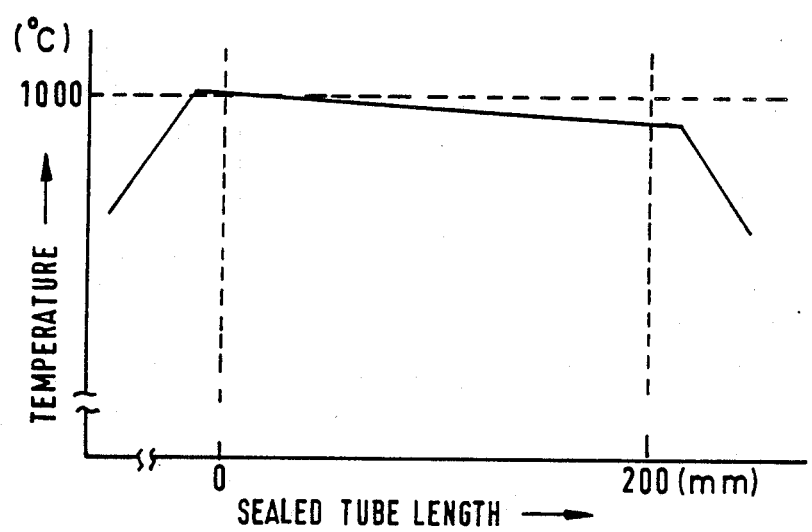
FIG. 13 is a graph showing the temperature distribution of the heating furnace used in the embodiment of present invention.

FIG. 12 shows a cross-section of the sealed tube used in the embodiment and its interior. As shown in FIG. 12, raw material 12, for instance polycrystal ZnSe, which has been produced beforehand by the CVD method and a large amount of Zn, which will form the atmosphere inside the sealed tube are sealed into sealed tube 11, which is formed of a heat-resistant material, for instance quartz. The tube is then exhausted to about $10^{-6}$ Torr and one end is melt-sealed. Sealed tube 11 is then placed in a heating furnace and heat treatment is carried out in this state for, for instance, about 20 hours. This heat treatment is carried out in a heating furnace with the temperature distribution shown in FIG. 13 at a heat treatment temperature of 1000° C.

For this treatment, for instance, a quartz ampul of diameter 20 mm and length 200 mm was used as sealed tube 11. 20 g of ZnSe 12 and 30 g of Zn as extractor 13 were respectively placed in one end of the tube and the vacuum-sealing described above was carried out. The tube was placed in a heating furnace with the temperature distribution show in FIG. 13 and heat treatment was carried out.

Figure 14:
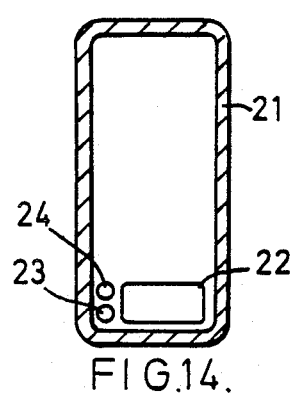
FIG. 14 is cross-section showing a state of the sealed tube used in the embodiments of this invention.

Next, as still another embodiment, as shown in FIG. 14, raw material 22 which had been heat-treated as above was placed in sealed tube 21, which was formed of quartz, together with Zn 23 and iodine 24 which formed the atmosphere inside the tube. The tube was exhausted to $10^{-6}$ Torr and the end of the tube was melt-sealed. The lower part of this tube 21, in which were placed raw material 22 and transporters 23 and 24 was placed in the high-temperature zone of a heating furnace and the upper part of the tube was placed in the low-temperature zone respectively, and heat treatment was carried out in this condition for, for instance, about 2 weeks. This heat treatment is carried out in a heating furnace with a temperature gradient as shown in FIG. 2, with the temperature of the high-temperature zone being, for instance, 850° C. and the temperature of the low-temperature zone being, for instance, 840° C. For this heat treatment, for instance, a quartz ampul of diameter 20 mm and length 50 mm was used as sealed tube 11. 10 g of ZnSe 22 raw material which had been processed as above and 100 mg of Zn as transporter 23 and 50 mg of iodine as transporter 24 were respectively housed in the lower part of the tube and the vacuum-sealing described above was carried out. Then the tube was placed in a heating furnace with the temperature distribution show in FIG. 13 and heat treatment was carried out.

Then, using a sealed tube of the same type as shown in FIG. 14, raw material 32 which had been treated as above was placed in the tube together with Se 33 and iodine 34 to form the atmosphere. The tube was exhausted to $10^-$Torr and the top end of the tube was melt-sealed. Heat treatment was carried out on this sealed tube 31 under the same conditions as for sealed tube 21. Incidentally, 10 g of ZnSe which is the raw material of this embodiment, 50 mg of Se and 50 mg of iodine were respectively placed in the lower part of the tube.

Impurities, such as Cu, in ZnSe polycrystal 32 which is processed in this way are adsorbed or deposited in the low-temperature zone by extractor 13, transporters 23 and 24. The respective impurity concentrations in the raw material and the material after it had been processed in this way were analysed by the ICP (Injected Coupled Plasma) method. The results shown in Table 5 below were obtained. Incidentally, an almost similar result was obtained when the transporters 33 and 34 are used as the atmosphere of the host atom.

TABLE 5

| (Units of concentration: wt ppm) | | | | | |
|---|---|---|---|---|---|
| | Impurity | | | | |
| Condition | Cu | Al | Cr | Mg | Si |
| Raw material after heat treatment | 0.01 | 0.1 | 0.05 | 0.05 | 0.2 |

TABLE 5-continued

| (Units of concentration: wt ppm) | | | | | |
|---|---|---|---|---|---|
| | Impurity | | | | |
| Condition | Cu | Al | Cr | Mg | Si |
| Raw material | 0.3 | 0.5 | 0.3 | 0.1 | 0.5 |

As can be seen in Table 5, it is clear that there was outstanding progress in the purification of the raw material to a high degree by the heat treatment and, in particular, a great effect in the extraction of heavy metals such as Cr and Cu.

Figure 15:
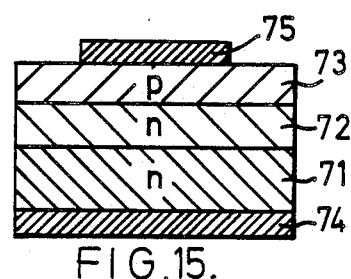
FIG. 15 is a cross-section of a p-n junction type light-emitting element formed by using a single crystal obtained by applying the method of this invention.

Next, FIG. 15, which shows the applyed embodiment, shows a blue light-emitting element. In the FIG. 71 is an n-type ZnSe substrate cyrstal obtained by the transport method using raw material obtained by this invention. On this substrate, n-type ZnSe crystal layer 72 and p-type ZnSe crystal layer 73 were formed as successive lamina by the MOCVD method using dimethyl zinc (DMZ) and dimethyl selenium (DMSe) as raw materials, thus constructing a p-n junction type light-emitting element such as LED. On this occasion, the main n-type impurity in n-type crystal layer 72 is Cl, and the main p-type crystal layer is Li. InGa electrode 74 has been formed on the underside of ZnSe substrate 71 as the n-type electrode, and AuZn electrode 75 has been formed on the upper surface of p-type layer 73 as the p-type electrode.

The light-emitting element obtained in this way displayed good blue light emission, and a light-emitting element which exhibited superior light-emission characteristics was thus obtained.

With this invention, the purity of Groups II–VI compound semiconductor material, which was difficult to purify to high degree by prior art, can very simply be achieved, and the getter-ing of various types of impurity is possible by the repetition of the heat treatments.

Also, in particular, by using this invention, it has become possible to obtain high-quality crystals. Moreover, by using this high-quality crystal as a raw material and producing single crystal from it, and then using that to produce substrate crystal, a semiconductor light-emitting element which displays good blue light emission properties can be obtained, and thus mass-production with even light-emitting characteristics can be designed.

Incidentally, although the above embodiments have been described for ZnSe, needless to say, similar affects can be obtained by using other Groups II–VI compound semiconductors such as ZnS, ZnTe, CdSe and CdTe. Also, for the substrate used for the light-emitting element of these inventions, naturally, all single crystal substrates which can be produced by the Groups II–VI compound semiconductor single crystal production methods mentioned above of this invention can be applied.

Moreover, the growth method for the Groups II–VI compound semiconductor layers is not limited to the MOCVD method, and it is possible to employ other gas-phase growth and MBE methods or liquid-phase growth methods.

In addition, these inventions can be embodied by various modifications within limits which do not deviate from their purport.

What is claimed is:

1. A method for removing impurities from a Group II-VI compound semiconductor, comprising the steps of:
providing said compound semiconductor in a sealed container having a high-temperature zone and a low-temperature zone, said semiconductor being disposed in the high-temperature zone;
providing at least one transporter adjacent said semiconductor in the high temperature zone of the sealed container, said transporter being either a group II element or a Group VI element, or a mixture of elements selected from either Group II or Group VI or from both Groups II and VI; and
providing heat to the sealed container such that the temperature of the high-temperature zone is maintained higher than the temperature of the lower temperature zone of the sealed container for generating an atmosphere of the transporter to transport impurities in said semiconductor from the high-temperature zone to the low-temperature zone of the container.

2. The method according to claim 1, wherein said Groups II-VI compound semiconductor includes one of ZnS, ZnSe, ZnSSe, ZnTe, CdSe and CdTe.

3. The method according to claim 2, wherein said Groups II-VI compound semiconductor includes a crystal of Groups II-VI compound semiconductor material for purifying impurities.

4. The method according to claim 2, wherein said Group II-VI compound semiconductor includes a polycrystal of Groups II-VI compound semiconductor material for carring out single crystallisation.

5. The method according to claim 1, wherein said transporter includes a mixture of either a Group II element or a Group VI element and a halogen element.

6. The method according to claim 1, wherein the temperature of said high-temperature zone is substantially equal to 850° C., and the temperature of said low-temperature zone is substantially equal to 840° C.

7. The method according to claim 1, wherein said sealed container is of a tube-like shape having upper and lower end portions wherein the upper end portion is heated at a temperature lower than the lower end portion.

8. The method according to claim 1, wherein the temperature difference between said high-temperature and low-temperature zones is in the range of 10°-100° C.

9. The method according to claim 1, wherein the temperature of heat provided to said sealed container is in the range of 700°-1250° C.

10. The method according to claim 1, further comprising the step of absorbing in an absorbent said transported impurities.

11. The method according to claim 10, wherein said absorbent includes a single crystal containing Group II-VI compound semiconductor.

12. The method according to claim 10, wherein said absorbent includes a single crystal containing Zn.

13. The method according to claim 10, wherein said sealed container has a constricted part and the absorbing step includes providing said absorbent in said constricted part.

14. The method according to claim 1, wherein said absorbing step includes melting said transporter and providing said semiconductor in said melted transporter.

15. The method according to claim 14, wherein said melted transporter includes Zn.

16. The method according to claim 14, further comprising the step of adding an active impurity for said semiconductor to said melted transporter.

17. The method according to claim 14, further comprising the steps of:
providing a crucible having a closed end adjacent said transporter intermediate the low-temperature and high-temperature zones thus separating one zone from another, said closed end of the crucible having a through hole for passing liquid therethrough;
providing the position of the low-temperature zone vertically with respect to the position of the high-temperature zone; and
turning said sealed container upside down with respect to the crucible to change the relative position between the low-temperature and high-temperature zones of the sealed container when the impurities in the semiconductor are substantially transported from the high-temperature zone to the low-temperature zone such that said transporter is separated from the said semiconductor.

18. The method according to claim 1, further comprising the step of providing contact between said semiconductor and the inner wall of said sealed container.

19. The method according to claim 1, further comprising the step of providing a diffusion agent adjacent said transporter and semiconductor provided in the high temperature zone of said sealed container.

20. The method according to claim 19, wherein said diffusion agent providing step includes providing Sulfur.

21. The method according to claim 10, wherein said absorbing means is disposed in the low-temperature zone of the sealed container.

22. The method according to claim 17, further comprising the step of providing at least one constriction in the sealed container for supporting the crucible.

* * * * *